(12) United States Patent
Chen et al.

(10) Patent No.: US 11,978,809 B2
(45) Date of Patent: May 7, 2024

(54) TRANSIENT VOLTAGE SUPPRESSION DEVICE

(71) Applicant: AMAZING MICROELECTRONIC CORP., New Taipei (TW)

(72) Inventors: Chih-Wei Chen, Zhubei (TW); Kuan-Yu Lin, New Taipei (TW); Kun-Hsien Lin, Hsinchu (TW)

(73) Assignee: AMAZING MICROELECTRONIC CORP., New Taipei (TW)

( * ) Notice: Subject to any disclaimer, the term of this patent is extended or adjusted under 35 U.S.C. 154(b) by 37 days.

(21) Appl. No.: 17/849,824

(22) Filed: Jun. 27, 2022

(65) Prior Publication Data

US 2023/0420576 A1 Dec. 28, 2023

(51) Int. Cl.
*H01L 29/87* (2006.01)
*H01L 29/06* (2006.01)

(52) U.S. Cl.
CPC .......... *H01L 29/87* (2013.01); *H01L 29/0684* (2013.01)

(58) Field of Classification Search
CPC ............... H01L 27/0248; H01L 29/861; H01L 27/0814; H01L 29/8611; H01L 29/87
See application file for complete search history.

(56) References Cited

U.S. PATENT DOCUMENTS

| | | | |
|---|---|---|---|
| 5,959,820 A | 9/1999 | Ker et al. | |
| 6,844,595 B2 | 1/2005 | Chen | |
| 7,773,356 B2 | 8/2010 | Ryu et al. | |
| 7,786,507 B2 | 8/2010 | Denison et al. | |
| 8,350,355 B2 | 1/2013 | Esmark | |
| 9,029,910 B2 | 5/2015 | Rountree | |
| 9,691,753 B2 | 6/2017 | Zhong et al. | |
| 10,141,300 B1 | 11/2018 | Mallikarjunaswamy | |
| 2009/0032838 A1 | 2/2009 | Tseng et al. | |
| 2020/0135714 A1* | 4/2020 | Mallikarjunaswamy | H01L 27/0262 |
| 2021/0020625 A1* | 1/2021 | Lin | H01L 29/7408 |

FOREIGN PATENT DOCUMENTS

| | | |
|---|---|---|
| TW | 200816474 A | 4/2008 |
| TW | 200828278 A | 6/2008 |
| TW | 202224137 A | 6/2022 |

* cited by examiner

*Primary Examiner* — Wasiul Haider
(74) *Attorney, Agent, or Firm* — Birch, Stewart, Kolasch & Birch, LLP

(57) ABSTRACT

A transient voltage suppression device includes at least one P-type lightly-doped structure and at least one electrostatic discharge structure. The electrostatic discharge structure includes an N-type lightly-doped well, an N-type well, a first P-type heavily-doped area, and a first N-type heavily-doped area. The N-type lightly-doped well is formed in the P-type lightly-doped structure. The N-type well is formed in the N-type lightly-doped well. The doping concentration of the N-type lightly-doped well is less than that of the N-type well. The first P-type heavily-doped area is formed in the N-type well. The first N-type heavily-doped area is formed in the P-type lightly-doped structure.

8 Claims, 7 Drawing Sheets

TRANSIENT VOLTAGE SUPPRESSION DEVICE

BACKGROUND OF THE INVENTION

Field of the Invention

The present invention relates to a suppression device, particularly to a transient voltage suppression device.

Description of the Related Art

Electrostatic Discharge (ESD) damage has become the main reliability issue for CMOS IC products fabricated in the nanoscale CMOS processes. ESD protection device is generally designed to bypass the ESD energy, so that the IC chips can be prevented from ESD damages.

The working principle of ESD protection device is shown in FIG. 1. In FIG. 1, the ESD protection device 1 is connected in parallel with a protected circuit 2 on the IC chip. The ESD protection device 1 would be triggered immediately when the ESD event occurs. In that way, the ESD protection device 1 can provide a superiorly low resistance path for discharging the transient ESD current, so that the energy of the ESD transient current can be bypassed by the ESD protection device 1. FIG. 2 is a cross-sectional view of a silicon-controlled rectifier in the conventional technology. Referring to FIG. 2, the silicon-controlled rectifier 3 includes a P-type substrate 30, an N-type well 31, an N-type heavily-doped area 32, a P-type heavily-doped area 33, an N-type heavily-doped area 34, a P-type heavily-doped area 35, a first pin 36, and a second pin 37. The N-type well 31 is formed in the P-type substrate 30. The P-type heavily-doped area 33 and the N-type heavily-doped area 32 are formed in the N-type well 31. The P-type heavily-doped area 35 and the N-type heavily-doped area 34 are formed in the P-type substrate 30. The N-type heavily-doped area 32 and the P-type heavily-doped area 33 are coupled to the first pin 36. The N-type heavily-doped area 34 and the P-type heavily-doped area 35 are coupled to the second pin 37. When a positive electrostatic discharge (ESD) voltage is applied to the first pin 36 and the second pin 37 is grounded, an ESD current flows from the first pin 36 to the second pin 37 through the P-type heavily-doped area 33, the N-type well 31, the P-type substrate 30, and the N-type heavily-doped area 34. In order to increase the holding voltage of the silicon-controlled rectifier 3, the doping concentration of the N-type well 31 is increased. However, the high doping concentration of the N-type well 31 will increase the junction capacitance between the N-type well 31 and the P-type substrate 30. Besides, the ESD current flow along the surface of the P-type substrate to decrease the ESD robustness of the silicon-controlled rectifier 3.

To overcome the abovementioned problems, the present invention provides a transient voltage suppression device, so as to solve the afore-mentioned problems of the prior art.

SUMMARY OF THE INVENTION

The present invention provides a transient voltage suppression device, which increases a holding voltage and has a low capacitance.

The present invention provides a transient voltage suppression device, which includes at least one P-type lightly-doped structure and at least one electrostatic discharge structure. The electrostatic discharge structure, formed in the P-type lightly-doped structure, includes an N-type lightly-doped well, an N-type well, a first P-type heavily-doped area, and a first N-type heavily-doped area. The N-type lightly-doped well is formed in the P-type lightly-doped structure. The N-type well is formed in the N-type lightly-doped well. The doping concentration of the N-type lightly-doped well is less than that of the N-type well. The first P-type heavily-doped area is formed in the N-type well. The first N-type heavily-doped area is formed in the P-type lightly-doped structure.

In an embodiment of the present invention, the first P-type heavily-doped area and the N-type lightly-doped well are coupled to a first pin. The first N-type heavily-doped area and the P-type lightly-doped structure are coupled to a second pin.

In an embodiment of the present invention, the electrostatic discharge structure further includes a second N-type heavily-doped area and a second P-type heavily-doped area. The second N-type heavily-doped area is formed in the N-type lightly-doped well. The first P-type heavily-doped area is located between the second N-type heavily-doped area and the first N-type heavily-doped area. The N-type lightly-doped well is coupled to the first pin through the second N-type heavily-doped area. The second P-type heavily-doped area is formed in the P-type lightly-doped structure. The P-type lightly-doped structure is coupled to the second pin through the second P-type heavily-doped area.

In an embodiment of the present invention, the electrostatic discharge structure further includes a third N-type heavily-doped area formed in the N-type lightly-doped well and located between the first P-type heavily-doped area and the first N-type heavily-doped area. The third N-type heavily-doped area is electrically floating.

In an embodiment of the present invention, the electrostatic discharge structure further includes a P-type well formed in the P-type lightly-doped structure. The doping concentration of the P-type well is higher than that of the P-type lightly-doped structure. The first N-type heavily-doped area and the second P-type heavily-doped area are formed in the P-type well. The P-type lightly-doped structure is coupled to the second pin through the second P-type heavily-doped area and the P-type well.

In an embodiment of the present invention, the second N-type heavily-doped area surrounds the N-type well and the first P-type heavily-doped area.

In an embodiment of the present invention, the at least one electrostatic discharge structure further includes two electrostatic discharge structures. The first N-type heavily-doped areas of the electrostatic discharge structures are coupled to each other through a conductive wire. The first P-type heavily-doped area and the N-type lightly-doped well of one of the electrostatic discharge structures are coupled to a first pin, and the first P-type heavily-doped area and the N-type lightly-doped well of another of the electrostatic discharge structures are coupled to a second pin.

In an embodiment of the present invention, the at least one electrostatic discharge structure further includes two electrostatic discharge structures, the at least one P-type lightly-doped structure includes two P-type lightly-doped structures. The first N-type heavily-doped areas of the electrostatic discharge structures and the P-type lightly-doped structures are coupled to each other through a conductive wire. The first P-type heavily-doped area and the N-type lightly-doped well of one of the electrostatic discharge structures are coupled to a first pin, and the first P-type heavily-doped area and the N-type lightly-doped well of another of the electrostatic discharge structures are coupled to a second pin.

In an embodiment of the present invention, the P-type lightly-doped structure is a P-type lightly-doped substrate.

In an embodiment of the present invention, the P-type lightly-doped structure is a P-type lightly-doped epitaxial layer formed on an N-type lightly-doped substrate.

To sum up, the transient voltage suppression device forms the N-type well between the N-type lightly-doped well and the first P-type heavily-doped area, thereby increasing a holding voltage and having a low capacitance.

Below, the embodiments are described in detail in cooperation with the drawings to make easily understood the technical contents, characteristics and accomplishments of the present invention.

DETAILED DESCRIPTION OF THE INVENTION

Figure 1:
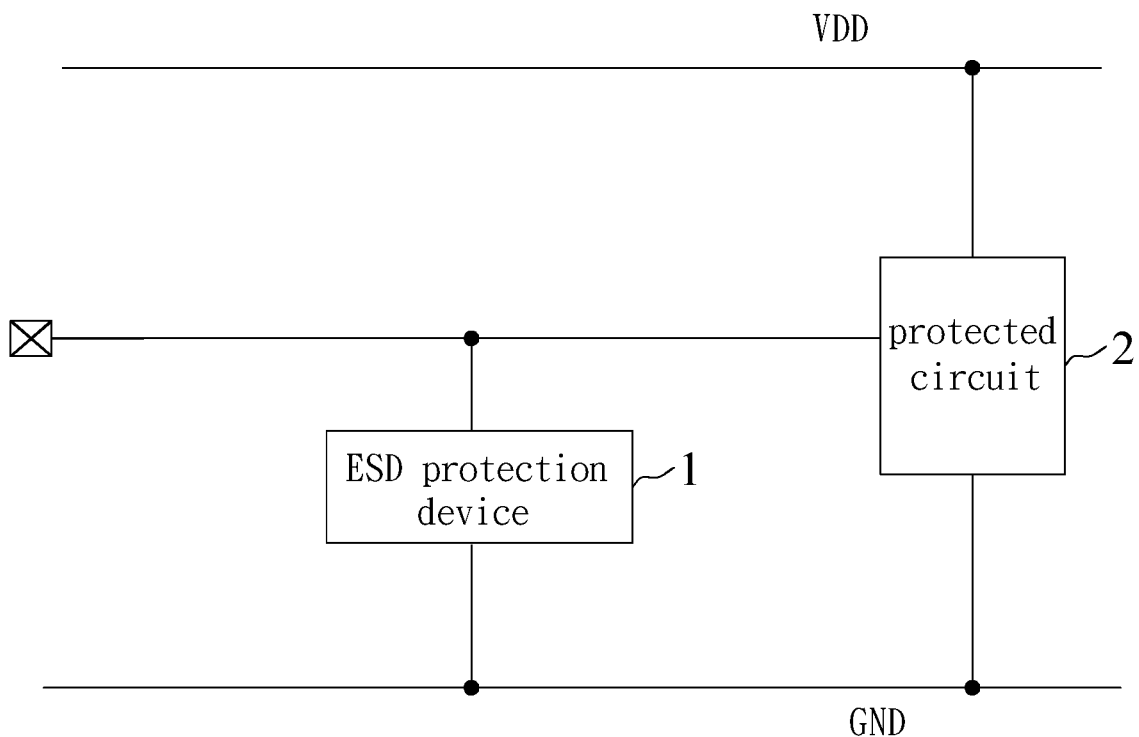
FIG. 1 is a schematic diagram illustrating an ESD protection device connected with a protected circuit on an IC chip in the conventional technology.
Figure 2:
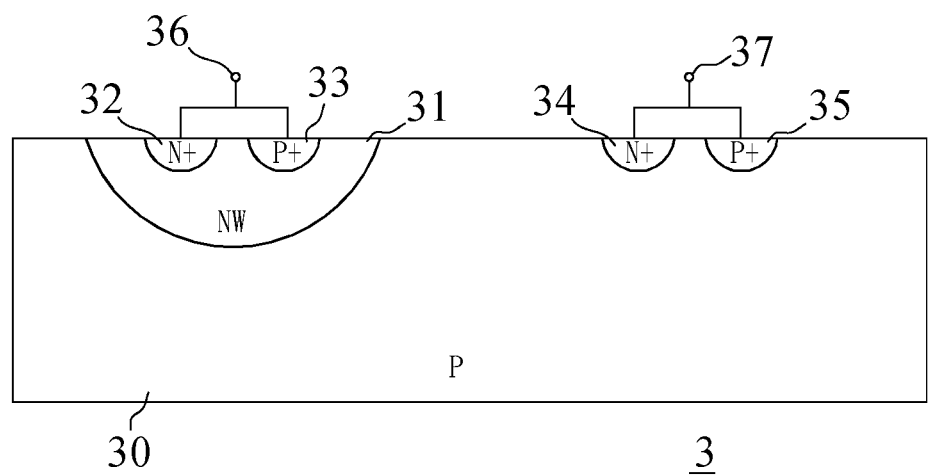
FIG. 2 is a cross-sectional view of a silicon-controlled rectifier in the conventional technology.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express that the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The phrases "be coupled with," "couples with," and "coupling with" are intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the article "a" and "the" includes the meaning of "one or at least one" of the element or component. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

In the following description, a transient voltage suppression device will be provided. The transient voltage suppression device forms an N-type well between the N-type lightly-doped well and a first P-type heavily-doped area, thereby increasing a holding voltage and having a low capacitance.

Figure 3:
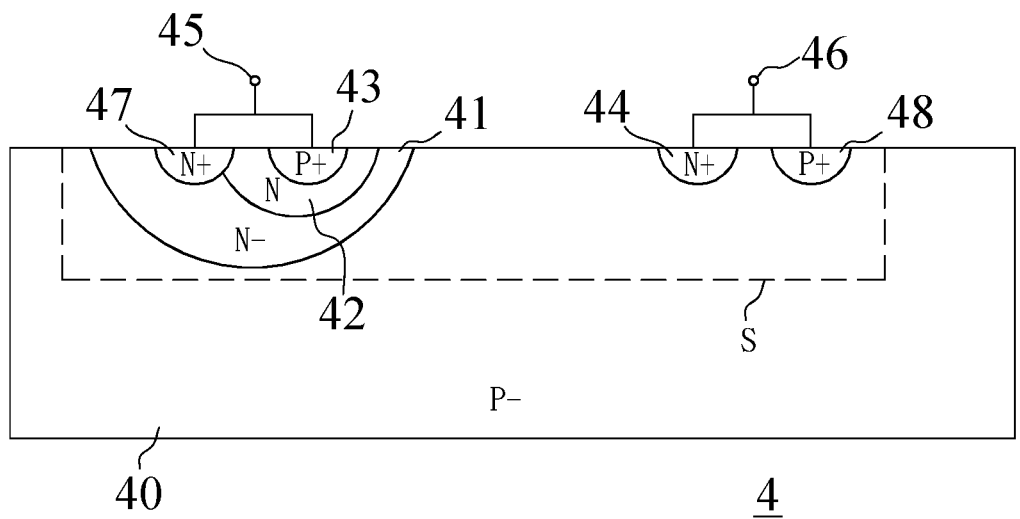
FIG. 3 is a cross-sectional view of a transient voltage suppression device according to a first embodiment of the present invention.

FIG. 3 is a cross-sectional view of a transient voltage suppression device according to a first embodiment of the present invention. Referring to FIG. 3, the first embodiment of the transient voltage suppression device 4 is introduced as follows. The transient voltage suppression device 4 includes at least one P-type lightly-doped structure and at least one electrostatic discharge structure S. For convenience and clarity, the first embodiment exemplifies one P-type lightly-doped structure 40 and one electrostatic discharge structure S. The electrostatic discharge structure S is formed in the P-type lightly-doped structure 40. The electrostatic discharge structure S includes an N-type lightly-doped well 41, an N-type well 42, a first P-type heavily-doped area 43, a first N-type heavily-doped area 44, a first pin 45, and a second pin 46. In the first embodiment, the P-type lightly-doped structure 40 is exemplified with a P-type lightly-doped substrate. The N-type lightly-doped well 41 is formed in the P-type lightly-doped structure 40. The N-type well 42 is formed in the N-type lightly-doped well 41. The doping concentration of the N-type lightly-doped well 41 is less than that of the N-type well 42. The first P-type heavily-doped area 43 is formed in the N-type well 42. The first N-type heavily-doped area 44 is formed in the P-type lightly-doped structure 40. The first P-type heavily-doped area 43 and the N-type lightly-doped well 41 may be coupled to the first pin 45. The first N-type heavily-doped area 44 and the P-type lightly-doped structure 40 are coupled to the second pin 46.

In some embodiments, the electrostatic discharge structure S may further include a second N-type heavily-doped area 47 and a second P-type heavily-doped area 48. The doping concentration of the second N-type heavily-doped area 47 is higher than that of the N-type well 42. The second N-type heavily-doped area 47 is formed in the N-type lightly-doped well 41. The first P-type heavily-doped area 43 is located between the second N-type heavily-doped area 47 and the first N-type heavily-doped area 44. The N-type lightly-doped well 41 is coupled to the first pin 45 through the second N-type heavily-doped area 47. The second P-type heavily-doped area 48 is formed in the P-type lightly-doped structure 40. The P-type lightly-doped structure 40 is coupled to the second pin 46 through the second P-type heavily-doped area 48.

When a positive electrostatic discharge (ESD) voltage is applied to the first pin 45 and the second pin 46 is grounded, an ESD current flows from the first pin 45 to the second pin 46 through the first P-type heavily-doped area 43, the N-type well 42, the N-type lightly-doped well 41, the P-type lightly-doped structure 40, and the first N-type heavily-doped area 44. In such a case, the transient voltage suppression device 4 functions like a silicon-controlled rectifier. In order to have a low capacitance, the transient voltage suppression device 4 needs to have a low junction capacitance between the N-type lightly-doped well 41 and the P-type lightly-doped structure 40. The first P-type heavily-doped area 43, the N-type well 42, the N-type lightly-doped well 41, and the P-type lightly-doped structure 40 form a PNP bipolar junction transistor. Owning to the doping concentration of the N-type well 42, the current gain of the PNP bipolar junction transistor can be decreased to increase the holding voltage of the transient voltage suppression device 4. When a positive ESD voltage is applied to the second pin 46 and the first pin 45 is grounded, an ESD current flows from the second pin 46 to the first pin 45 through the second P-type heavily-doped area 48, the P-type lightly-doped structure 40, the N-type lightly-doped well 41, and the second N-type heavily-doped area 47. In such a case, the transient voltage suppression device 4 functions like a diode.

Figure 4:
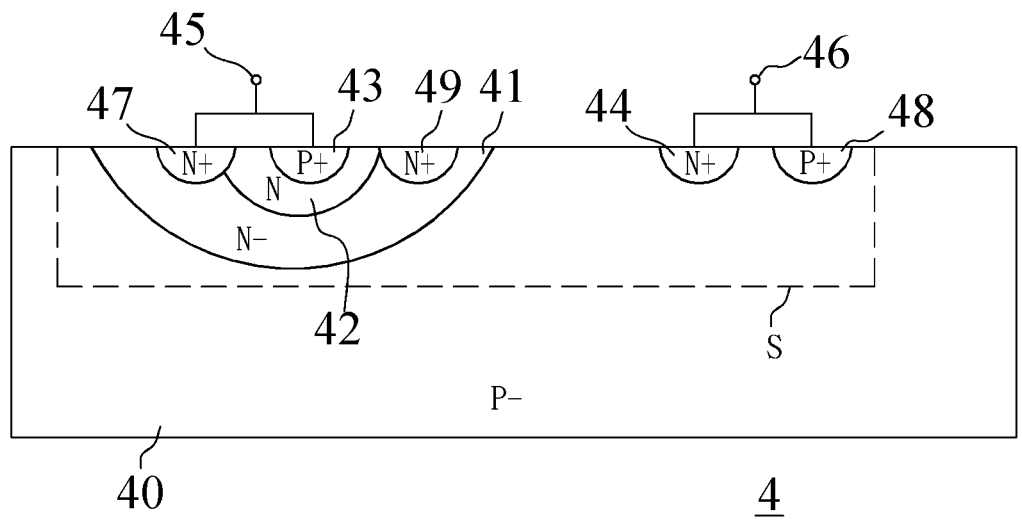
FIG. 4 is a cross-sectional view of a transient voltage suppression device according to a second embodiment of the present invention.

FIG. 4 is a cross-sectional view of a transient voltage suppression device according to a second embodiment of the present invention. Referring to FIG. 4, the second embodiment of the transient voltage suppression device 4 is introduced as follows. Compared with the first embodiment, the electrostatic discharge structure S of the second embodiment further includes a third N-type heavily-doped area 49 formed in the N-type lightly-doped well 41 and located between the first P-type heavily-doped area 43 and the first N-type heavily-doped area 44. The third N-type heavily-doped area 49 is electrically floating. The other features have been described previously in the first embodiment so will not be reiterated.

In the second embodiment, the first P-type heavily-doped area 43, the N-type well 42, the third N-type heavily-doped area 49, the N-type lightly-doped well 41, and the P-type lightly-doped structure 40 form a horizontal PNP bipolar junction transistor. Owning to the floating third N-type heavily-doped area 49, the current gain of the horizontal PNP bipolar junction transistor is lower than that of the vertical PNP bipolar junction transistor, which is formed by the first P-type heavily-doped area 43, the N-type well 42, the N-type lightly-doped well 41, and the P-type lightly-doped structure 40. As a result, the holding voltage of the second embodiment is higher than that of the first embodiment when the positive ESD voltage is applied to the first pin 45 and the second pin 46 is grounded. Since the current gain of the horizontal PNP bipolar junction transistor is suppressed, most of ESD current flow through the deeper vertical PNP bipolar junction transistor to enhance the ESD robustness of the transient voltage suppression device 4 when the positive ESD voltage is applied to the first pin 45 and the second pin 46 is grounded.

When the positive ESD voltage is applied to the second pin 46 and the first pin 45 is grounded, the ESD current flows from the second pin 46 to the first pin 45 through the second P-type heavily-doped area 48, the P-type lightly-doped structure 40, the N-type lightly-doped well 41, the third N-type heavily-doped area 49, the N-type well 42, and the second N-type heavily-doped area 47. A first path through the second P-type heavily-doped area 48, the P-type lightly-doped structure 40, the N-type lightly-doped well 41, and the second N-type heavily-doped area 47 is far away from the surface of the P-type lightly-doped structure 40. A second path through the second P-type heavily-doped area 48, the P-type lightly-doped structure 40, the N-type lightly-doped well 41, the third N-type heavily-doped area 49, the N-type well 42, and the second N-type heavily-doped area 47 is close to the surface of the P-type lightly-doped structure 40. Thus, the second path is shorter than the first path, and the conduction impedance of the second path is lower than that of the first path.

Figure 5:
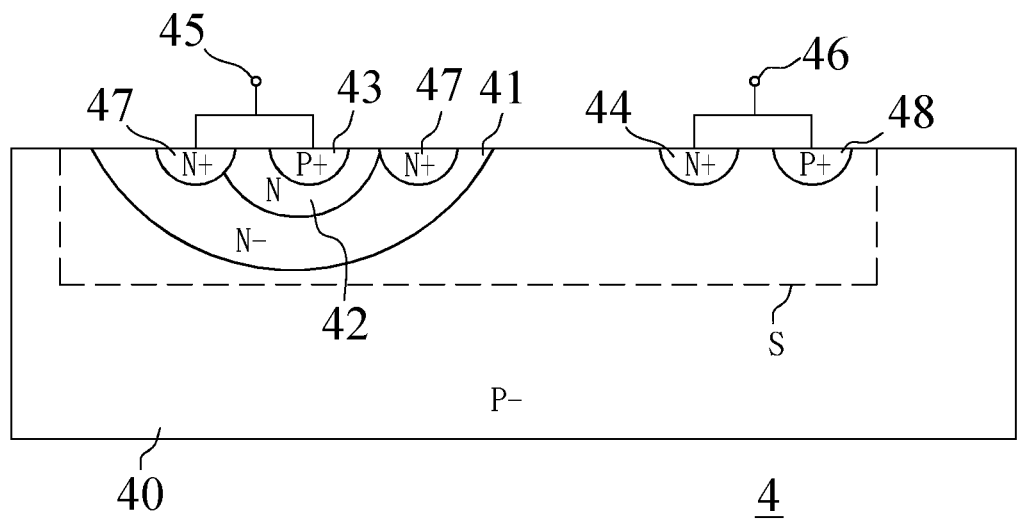
FIG. 5 is a cross-sectional view of a transient voltage suppression device according to a third embodiment of the present invention.

FIG. 5 is a cross-sectional view of a transient voltage suppression device according to a third embodiment of the present invention. Referring to FIG. 5, the third embodiment of the transient voltage suppression device 4 is introduced as follows. Compared with the first embodiment, the second N-type heavily-doped area 47 of the third embodiment surrounds the N-type well 42 and the first P-type heavily-doped area 43. The other features have been described previously in the first embodiment so will not be reiterated.

In the third embodiment, the first P-type heavily-doped area 43, the N-type well 42, the second N-type heavily-doped area 47, the N-type lightly-doped well 41, and the P-type lightly-doped structure 40 form a horizontal PNP bipolar junction transistor. Owning to the positively-biased second N-type heavily-doped area 47, the current gain of the horizontal PNP bipolar junction transistor is lower than that of the vertical PNP bipolar junction transistor when the positive ESD voltage is applied to the first pin 45 and the second pin 46 is grounded. As a result, the holding voltage of the third embodiment is higher than that of the second embodiment when the positive ESD voltage is applied to the first pin 45 and the second pin 46 is grounded. Since the current gain of the horizontal PNP bipolar junction transistor is suppressed, most of ESD current flow through the deeper vertical PNP bipolar junction transistor to enhance the ESD robustness of the transient voltage suppression device 4 when the positive ESD voltage is applied to the first pin 45 and the second pin 46 is grounded.

When the positive ESD voltage is applied to the second pin 46 and the first pin 45 is grounded, the ESD current flows from the second pin 46 to the first pin 45 through the second P-type heavily-doped area 48, the P-type lightly-doped structure 40, the N-type lightly-doped well 41, the second N-type heavily-doped area 47, the N-type well 42, and the second N-type heavily-doped area 47. The first path through the second P-type heavily-doped area 48, the P-type lightly-doped structure 40, the N-type lightly-doped well 41, and the second N-type heavily-doped area 47 is far away from the surface of the P-type lightly-doped structure 40. A second path through the second P-type heavily-doped area 48, the P-type lightly-doped structure 40, the N-type lightly-doped well 41, the second N-type heavily-doped area 47, the N-type well 42, and the second N-type heavily-doped area 47 is close to the surface of the P-type lightly-doped structure 40. Thus, the second path is shorter than the first path, and the conduction impedance of the second path is lower than that of the first path.

Figure 6:
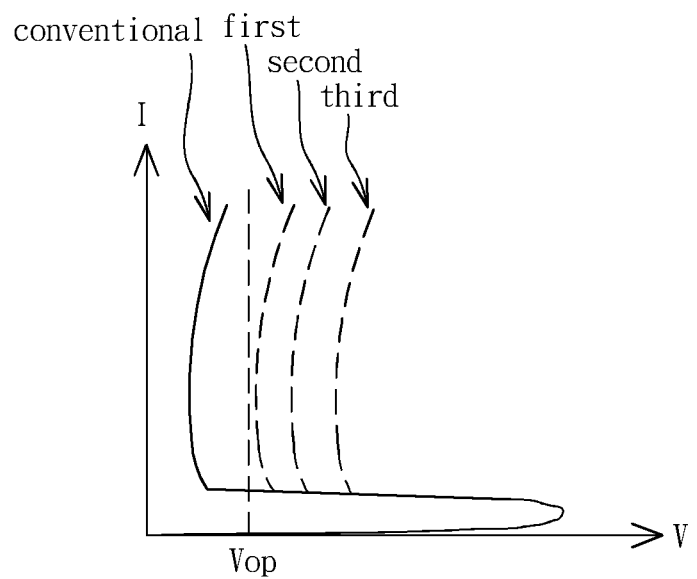
FIG. 6 is a diagram illustrating I-V curves of transient voltage suppression devices according to the first, second, and third embodiments of the present invention.

FIG. 6 is a diagram illustrating I-V curves of transient voltage suppression devices according to the first, second, and third embodiments of the present invention. Referring to FIG. 6, the I-V curves of the silicon-controlled rectifiers of the conventional technology and the first, second, and third embodiments represented. As illustrated in FIG. 6, the holding voltage of the conventional silicon-controlled rectifier is lower than the operating voltage Vop of a protected circuit. On the contrary, the holding voltages of the silicon-controlled rectifiers of the first, second, and third embodiments are higher than the operating voltage Vop of the protected circuit. Besides, the holding voltage of the silicon-controlled rectifier of the third embodiment is higher than that of the second embodiment. The holding voltage of the silicon-controlled rectifier of the second embodiment is higher than that of the first embodiment.

Figure 7:
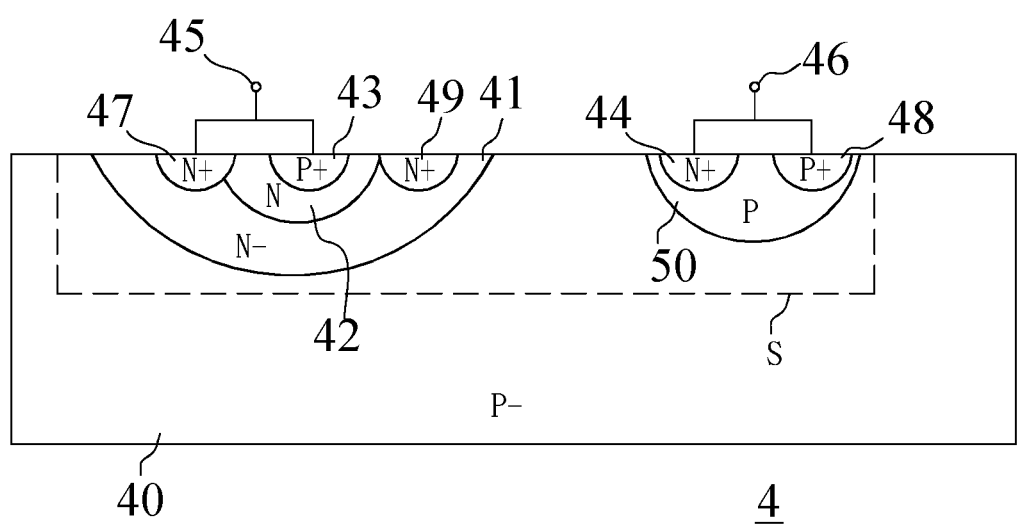
FIG. 7 is a cross-sectional view of a transient voltage suppression device according to a fourth embodiment of the present invention.

FIG. 7 is a cross-sectional view of a transient voltage suppression device according to a fourth embodiment of the present invention. Referring to FIG. 7, the fourth embodiment of the transient voltage suppression device 4 is introduced as follows. Compared with the second embodiment, the electrostatic discharge structure S of the fourth embodiment further includes a P-type well 50 formed in the P-type lightly-doped structure 40. The doping concentration of the P-type well 50 is higher than that of the P-type lightly-doped structure 40. The first N-type heavily-doped area 44 and the second P-type heavily-doped area 48 are formed in the P-type well 50. The P-type lightly-doped structure 40 is coupled to the second pin 46 through the second P-type heavily-doped area 48 and the P-type well 50. The other features have been described previously in the second embodiment so will not be reiterated.

In the fourth embodiment, the N-type well 42, the third N-type heavily-doped area 49, the N-type lightly-doped well 41, the P-type lightly-doped structure 40, the P-type well 50, and the first N-type heavily-doped area 44 form a horizontal NPN bipolar junction transistor. Owning to the P-type well 50 whose doping concentration is higher than the doping concentration of the P-type lightly-doped structure 40, the current gain of the horizontal NPN bipolar junction transistor is suppressed. As a result, the holding voltage of the fourth embodiment is higher than that of the second embodiment when the positive ESD voltage is applied to the first pin 45 and the second pin 46 is grounded. Since the current gain of the horizontal NPN bipolar junction transistor is suppressed, most of ESD current flow through the deeper vertical PNP bipolar junction transistor to enhance the ESD robustness of the transient voltage suppression device 4 when the positive ESD voltage is applied to the first pin 45 and the second pin 46 is grounded.

When the positive ESD voltage is applied to the second pin 46 and the first pin 45 is grounded, the ESD current flows from the second pin 46 to the first pin 45 through the second P-type heavily-doped area 48, the P-type well 50, the P-type lightly-doped structure 40, the N-type lightly-doped well 41, the third N-type heavily-doped area 49, the N-type well 42, and the second N-type heavily-doped area 47.

The P-type well 50 is also applied to the architectures of FIG. 3, FIG. 4, and FIG. 5. When the P-type well 50 is applied to the architectures of FIG. 3, FIG. 4, and FIG. 5, the P-type well 50 formed in the P-type lightly-doped structure 40. Besides, the doping concentration of the P-type well 50 is higher than that of the P-type lightly-doped structure 40. The first N-type heavily-doped area 44 and the second P-type heavily-doped area 48 are formed in the P-type well 50.

In order to form a bidirectional transient voltage suppression device with high holding voltages, the fifth and sixth embodiments of the present invention are introduced as follows.

Figure 8:
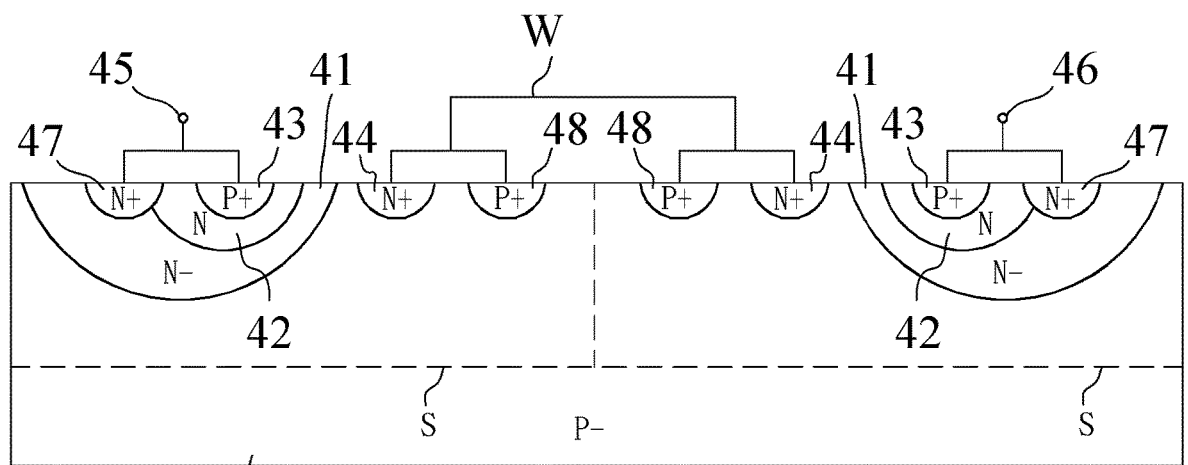
FIG. 8 is a cross-sectional view of a transient voltage suppression device according to a fifth embodiment of the present invention.

FIG. 8 is a cross-sectional view of a transient voltage suppression device according to a fifth embodiment of the present invention. Referring to FIG. 8, the fifth embodiment is different from the first embodiment in that the fifth embodiment forms two electrostatic discharge structures S. In addition, the first N-type heavily-doped areas 44 and the second P-type heavily-doped areas 48 of the electrostatic discharge structures S are coupled to each other through a conductive wire W. The first P-type heavily-doped area 43, the N-type lightly-doped well 41 and the second N-type heavily-doped area 47 of one of the electrostatic discharge structures S are coupled to the first pin 45. The first P-type heavily-doped area 43, the N-type lightly-doped well 41 and the second N-type heavily-doped area 47 of another of the electrostatic discharge structures S are coupled to the second pin 46.

When a positive ESD voltage is applied to the first pin 45 and the second pin 46 is grounded, an ESD current flows from the first pin 45 to the second pin 46 through the first P-type heavily-doped area 43, the N-type well 42, the N-type lightly-doped well 41, the P-type lightly-doped structure 40, the first N-type heavily-doped area 44, the conductive wire W, the second P-type heavily-doped area 48, the P-type lightly-doped structure 40, the N-type lightly-doped well 41, the N-type well 42, and the second N-type heavily-doped area 47. When a positive ESD voltage is applied to the second pin 46 and the first pin 45 is grounded, an ESD current flows from the second pin 46 to the first pin 45 through the first P-type heavily-doped area 43, the N-type well 42, the N-type lightly-doped well 41, the P-type lightly-doped structure 40, the first N-type heavily-doped area 44, the conductive wire W, the second P-type heavily-doped area 48, the P-type lightly-doped structure 40, the N-type lightly-doped well 41, the N-type well 42, and the second N-type heavily-doped area 47.

Figure 9:
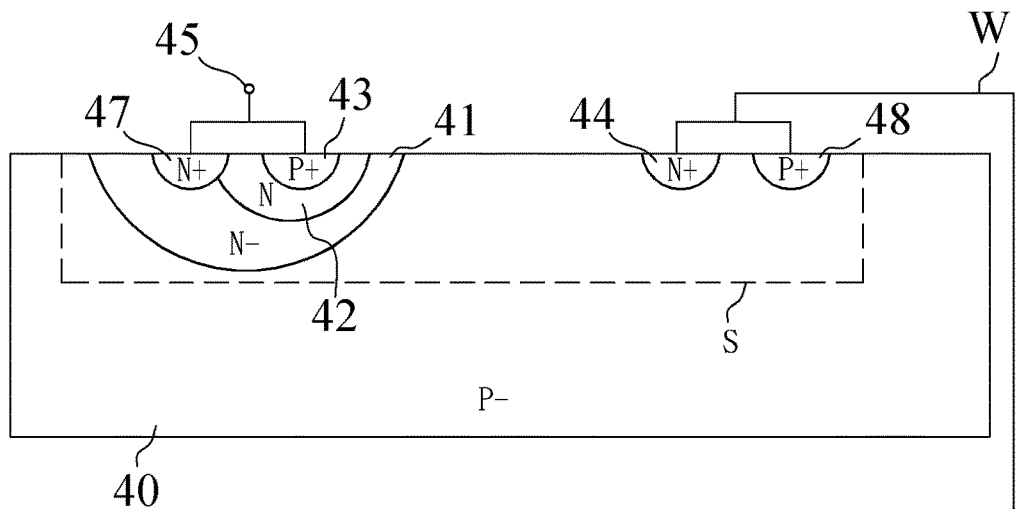
FIG. 9 is a cross-sectional view of a transient voltage suppression device according to a sixth embodiment of the present invention.
Figure 9:
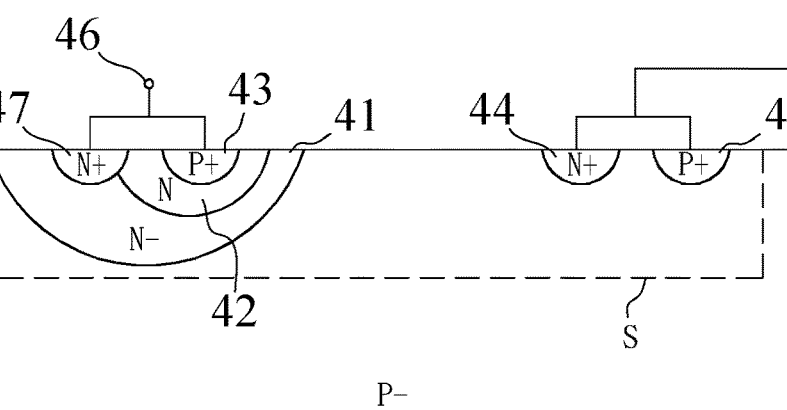

FIG. 9 is a cross-sectional view of a transient voltage suppression device according to a sixth embodiment of the present invention. Referring to FIG. 9, the sixth embodiment is different from the first embodiment in that the sixth embodiment forms two electrostatic discharge structures S and two P-type lightly-doped structures 40. In addition, the first N-type heavily-doped areas 44 and the second P-type heavily-doped areas 48 of the electrostatic discharge structures S and the P-type lightly-doped structures 40 are coupled to each other through a conductive wire W. The first P-type heavily-doped area 43, the second N-type heavily-doped area 47 and the N-type lightly-doped well 41 of one of the electrostatic discharge structures S are coupled to the first pin and the first P-type heavily-doped area 43, the second N-type heavily-doped area 47 and the N-type lightly-doped well 41 of another of the electrostatic discharge structures S are coupled to the second pin 46.

When a positive ESD voltage is applied to the first pin 45 and the second pin 46 is grounded, an ESD current flows from the first pin 45 to the second pin 46 through the first P-type heavily-doped area 43, the N-type well 42, the N-type lightly-doped well 41, the P-type lightly-doped structure 40, the first N-type heavily-doped area 44, the conductive wire W, the second P-type heavily-doped area 48, the P-type lightly-doped structure 40, the N-type lightly-doped well 41, the N-type well 42, and the second N-type heavily-doped area 47. When a positive ESD voltage is applied to the second pin 46 and the first pin 45 is grounded, an ESD current flows from the second pin 46 to the first pin 45 through the first P-type heavily-doped area 43, the N-type well 42, the N-type lightly-doped well 41, the P-type lightly-doped structure 40, the first N-type heavily-doped area 44, the conductive wire W, the first second P-type heavily-doped area 48, the P-type lightly-doped structure the N-type lightly-doped well 41, the N-type well 42, and the second N-type heavily-doped area 47.

Figure 10:
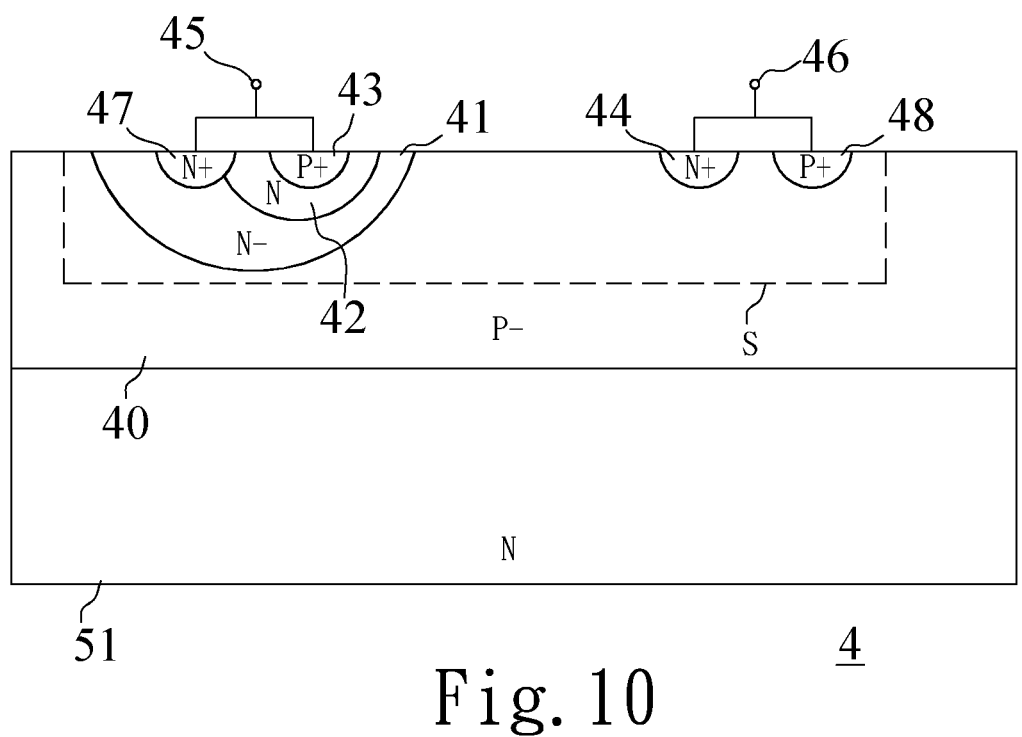
FIG. 10 is a cross-sectional view of a transient voltage suppression device according to a seventh embodiment of the present invention.

FIG. 10 is a cross-sectional view of a transient voltage suppression device according to a seventh embodiment of the present invention. Referring to FIG. 10, the seventh embodiment is introduced as follows. The seventh embodiment is different from the first embodiment in the P-type lightly-doped structure 40. In the seventh embodiment, the P-type lightly-doped structure 40 is a P-type lightly-doped epitaxial layer formed on an N-type lightly-doped substrate 51. The other features have been described previously in the first embodiment so will not be reiterated. The architecture of FIG. 10 can be applied to the other embodiments.

The P-type well 50 in FIG. 7 is also applied to the architectures of FIG. 8, FIG. 9, and FIG. 10. When the P-type well 50 is applied to the architectures of FIG. 8, FIG. 9, and FIG. 10, the P-type well 50 formed in each P-type lightly-doped structure 40. Besides, the doping concentration of the P-type well 50 is higher than that of the P-type lightly-doped structure 40. The first N-type heavily-doped area 44 and the corresponding second P-type heavily-doped area 48 are formed in the P-type well 50.

According to the embodiments provided above, the transient voltage suppression device forms the N-type well between the N-type lightly-doped well and the first P-type heavily-doped area, thereby increasing a holding voltage and having a low capacitance.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:
1. A transient voltage suppression device comprising:
at least one P-type lightly-doped structure; and
at least one electrostatic discharge structure, formed in the at least one P-type lightly-doped structure, comprising:
an N-type lightly-doped well formed in the at least one P-type lightly-doped structure;
an N-type well formed in the N-type lightly-doped well, wherein doping concentration of the N-type lightly-doped well is less than that of the N-type well;
a first P-type heavily-doped area formed in the N-type well; and
a first N-type heavily-doped area formed in the at least one P-type lightly-doped structure, wherein the first P-type heavily-doped area and the N-type lightly-doped well are coupled to a first pin, and the first N-type heavily-doped area and the at least one P-type lightly-doped structure are coupled to a second pin;
a second N-type heavily-doped area formed in the N-type lightly-doped well, wherein the first P-type heavily-doped area is located between the second N-type heavily-doped area and the first N-type heavily-doped area, the N-type lightly-doped well is coupled to the first pin through the second N-type heavily-doped area, and the second N-type heavily-doped area directly interfaces the N-type lightly-doped well and the N-type well; and
a second P-type heavily-doped area formed in the at least one P-type lightly-doped structure, wherein the at least one P-type lightly-doped structure is coupled to the second pin through the second P-type heavily-doped area.

2. The transient voltage suppression device according to claim 1, wherein the at least one electrostatic discharge structure further comprises a third N-type heavily-doped area formed in the N-type lightly-doped well and located between the first P-type heavily-doped area and the first N-type heavily-doped area, wherein the third N-type heavily-doped area is electrically floating.

3. The transient voltage suppression device according to claim 2, wherein the at least one electrostatic discharge structure further comprises a P-type well formed in the at least one P-type lightly-doped structure, wherein doping concentration of the P-type well is higher than that of the at least one P-type lightly-doped structure, the first N-type heavily-doped area and the second P-type heavily-doped area are formed in the P-type well, and the at least one P-type lightly-doped structure is coupled to the second pin through the second P-type heavily-doped area and the P-type well.

4. The transient voltage suppression device according to claim 1, wherein the second N-type heavily-doped area surrounds the N-type well and the first P-type heavily-doped area.

5. The transient voltage suppression device according to claim 1, wherein the at least one electrostatic discharge structure further comprises two electrostatic discharge structures, the first N-type heavily-doped areas of the electrostatic discharge structures are coupled to each other through a conductive wire, the first P-type heavily-doped area and the N-type lightly-doped well of one of the electrostatic discharge structures are coupled to a first pin, and the first P-type heavily-doped area and the N-type lightly-doped well of another of the electrostatic discharge structures are coupled to a second pin.

6. The transient voltage suppression device according to claim 1, wherein the at least one electrostatic discharge structure further comprises two electrostatic discharge structures, the at least one P-type lightly-doped structure comprises two P-type lightly-doped structures, the first N-type heavily-doped areas of the electrostatic discharge structures and the P-type lightly-doped structures are coupled to each other through a conductive wire, the first P-type heavily-doped area and the N-type lightly-doped well of one of the electrostatic discharge structures are coupled to a first pin, and the first P-type heavily-doped area and the N-type lightly-doped well of another of the electrostatic discharge structures are coupled to a second pin.

7. The transient voltage suppression device according to claim 1, wherein the at least one P-type lightly-doped structure is a P-type lightly-doped substrate.

8. The transient voltage suppression device according to claim 1, wherein the at least one P-type lightly-doped structure is a P-type lightly-doped epitaxial layer formed on an N-type lightly-doped substrate.

* * * * *